United States Patent [19]

Kamijima et al.

[11] Patent Number: 5,002,448
[45] Date of Patent: Mar. 26, 1991

[54] CIRCUIT BOARD ASSEMBLING DEVICE

[75] Inventors: Soichiro Kamijima; Tsuneji Togami, both of Iwata, Japan

[73] Assignee: Yamaha Hatsudoki Kabushiki Kaisha, Iwata, Japan

[21] Appl. No.: 146,572

[22] Filed: Jan. 21, 1988

[30] Foreign Application Priority Data

Jan. 20, 1987 [JP] Japan .................................. 62-11140

[51] Int. Cl.[5] .............................................. B23P 19/00
[52] U.S. Cl. ..................................... 414/225; 414/751; 901/16; 29/739; 29/791
[58] Field of Search ............... 414/222, 225, 751, 589; 901/8, 16; 29/739, 740, 741, 783, 787, 791

[56] References Cited

U.S. PATENT DOCUMENTS

| | | | |
|---|---|---|---|
| 3,609,843 | 10/1971 | Fiegel, Jr. et al. | 414/751 X |
| 3,884,363 | 5/1975 | Ajlouny | 414/751 X |
| 3,986,623 | 10/1976 | Keller | 414/225 |
| 4,177,002 | 12/1979 | Motoda et al. | 414/751 |
| 4,372,538 | 2/1983 | Balfanz | 414/751 X |
| 4,466,770 | 8/1984 | Peroutky | 414/751 |
| 4,484,293 | 11/1984 | Minucciani et al. | 901/8 X |
| 4,573,262 | 3/1986 | Dornes et al. | 29/739 |
| 4,577,748 | 3/1986 | Boegner et al. | 414/751 X |
| 4,600,358 | 7/1986 | Graf | 901/16 X |
| 4,623,294 | 11/1986 | Schröder | 901/8 X |
| 4,648,774 | 3/1987 | Dorumsgaard et al. | 901/16 X |
| 4,781,517 | 11/1988 | Pearce et al. | 414/590 |
| 4,800,640 | 1/1989 | Miyazaki et al. | 29/794 X |

FOREIGN PATENT DOCUMENTS

| | | | |
|---|---|---|---|
| 0655506 | 4/1979 | U.S.S.R. | 414/589 |
| 0779061 | 11/1980 | U.S.S.R. | 901/16 |

Primary Examiner—David A. Bucci
Assistant Examiner—William M. Hienz
Attorney, Agent, or Firm—Ernest A. Beutler

[57] ABSTRACT

Two embodiments of assembly devices particularly adapted for assembling components such as IC chips on a printed circuit board. The arrangement includes a pair of carriages each of which supports gripping means and the supporting and driving arrangements for the carriages permits a very compact assembly and prevents interference between the carriages during their movement. The carriage has an improved supporting arrangement that prevents binding and embodiments are shown wherein the gripping devices carried by the carriages may either pick up units from one or both sides of the device.

17 Claims, 6 Drawing Sheets

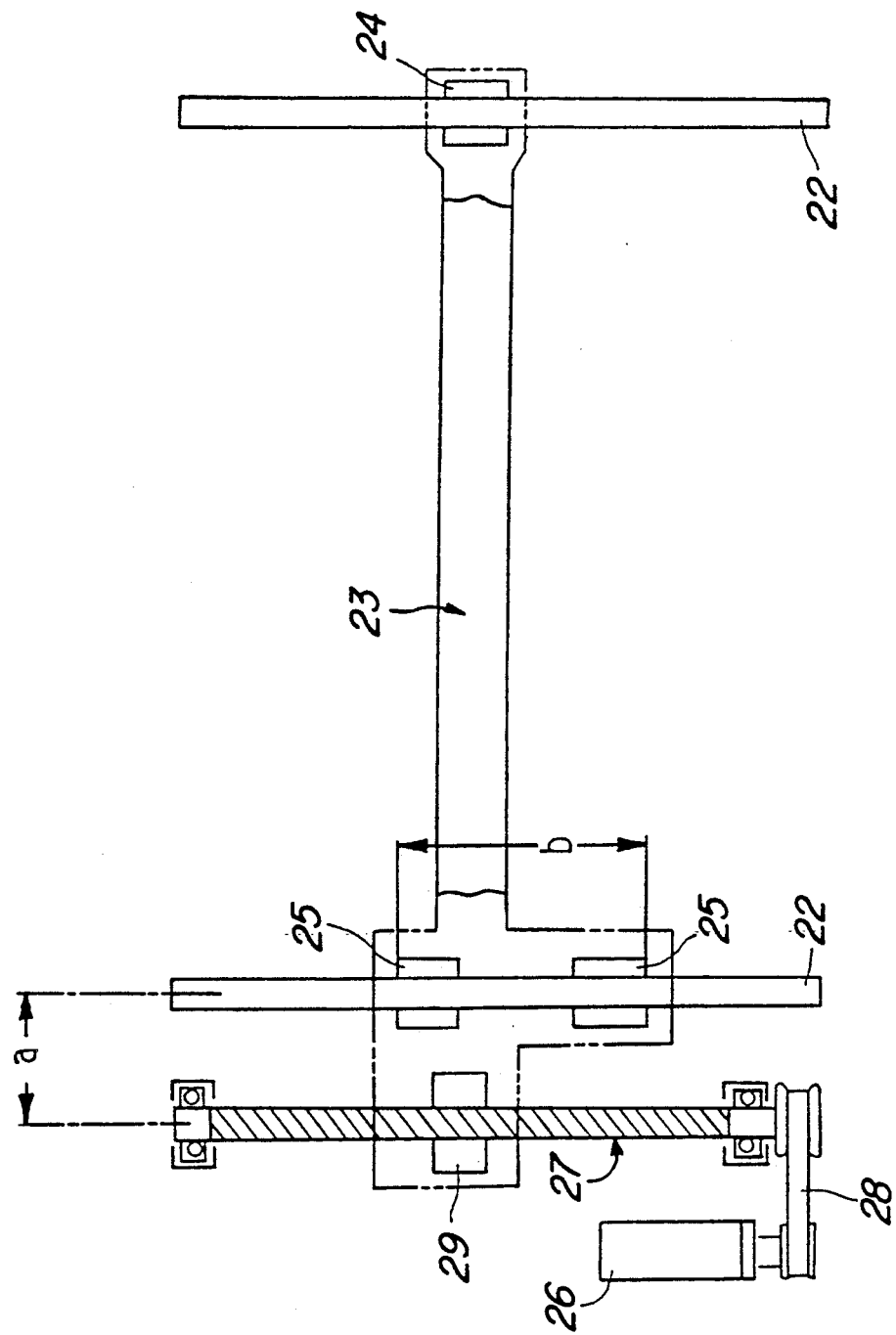

CIRCUIT BOARD ASSEMBLING DEVICE

BACKGROUND OF THE INVENTION

This invention relates to an for placing small workpieces on a work table such as is employed in assembling circuit boards and more particularly to an improved arrangement for this purpose.

In many types of assembling devices, workpieces are assembled onto a device that is supported on a work table with the workpieces being supplied from a supply at one side or the other of the work table. Normally the workpieces are picked up by a gripping unit which is moved in the X—X and Y—Y directions in order to place the workpiece at the desired location upon the work table. Such devices lend themselves to automatic operation. However, the previously proposed devices for this purpose have been rather cumbersome and occupy a large area.

It is, therefore, a principal object of this invention to provide an improved and compact arrangement for assembling workpieces onto an article supported on a table.

It is a further object of this invention to provide an improved compact and high speed assembling device for such applications as assembling circuit boards.

In connection with assembling devices of the type aforedescribed, the supporting arrangement for the gripper that picks up the workpieces and places them on the table is such that it is not possible to employ plural grippers at the same time. As a result, the assembly procedure may be extremely slow.

It is, therefore, a principal object of this invention to provide an arrangement wherein a plurality of workpiece gripping means may be moved at the same time in order to assemble workpieces onto an article supported on the work table.

In connection with the support for the gripping devices that move the workpieces from their supply to the work table, it has already been noted that the gripper must be moved in an X—X direction and a Y—Y direction. It is desirable to provide an accurate support for permitting the movement of the grippers and one which will nevertheless be compact.

It is, therefore, a still further object of this invention to provide an improved arrangement for moving a gripping device in two directions.

SUMMARY OF THE INVENTION

A first feature of this invention is adapted to be embodied in an arrangement for placing workpieces from supplies located at opposite sides of a work table upon an article that is supported on the work table. This arrangement comprises a pair of spaced apart guide rails that extend between the sides. First and second carriages are each supported for movement by the guide rails between a position contiguous to the respective one of the sides and a position over the article supported on the work table. A pair of gripping means are each supported for movement along a respective one of the carriages and are adapted to pick up a workpiece when the respective carriage is contiguous to the respective side and to deposit the workpiece on the article. First drive means are positioned contiguous to one of the guide rails for driving one of the carriages along the guide rails. Second drive means are positioned contiguous to the other of the guide rails for driving the other of the carriages therealong. Further drive means are provided for driving the gripping means along the respective carriages.

Another feature of the invention is also adapted to be embodied in an arrangement for placing workpieces from supplies located on opposite sides of a work table upon an article supported upon the work table. In accordance with this feature of the invention, a pair of spaced apart guide rails extend between the sides and first and second carriages are each supported for movement by the guide rails. A pair of gripping means are supported each by a respective one of the carriages. The gripping means are supported on their respective carriages on the side facing the other of the carriages and the carriages have sufficient movement along the guide rails so that either gripping means may pick up a workpiece from the supply at either side of the work table.

Yet another feature of the invention is adapted to be embodied in a supply and transporting device for facilitating the placement of small components on an article supported by a work table defining an X—X direction and a Y—Y direction. The device comprises a pair of guide rails extending in one of the directions and being spaced apart in the other of the directions. A carriage elongated in the other direction is slidably supported for movement in the first direction upon the pair of guide rails by a first bearing that is carried at one end of the carriage means and which is engaged with a first of the guide rails and a pair of spaced apart bearings carried by the carriage and engaged with the other of the guide rails. Gripping means are carried by the carriage for movement in the other direction and are adapted to pick up a small component from a first location and deposit it at a second location on the work table. Drive means are incorporated for moving the carriage along the guide rails and for moving the gripping means along the carriage.

BRIEF DESCRIPTION OF THE DRAWINGS

FIG. 4 is an enlarged schematic view showing the supporting arrangement for one of the carriages and the driving mechanism for it.

DETAILED DESCRIPTION OF THE PREFERRED EMBODIMENTS

Figure 1:
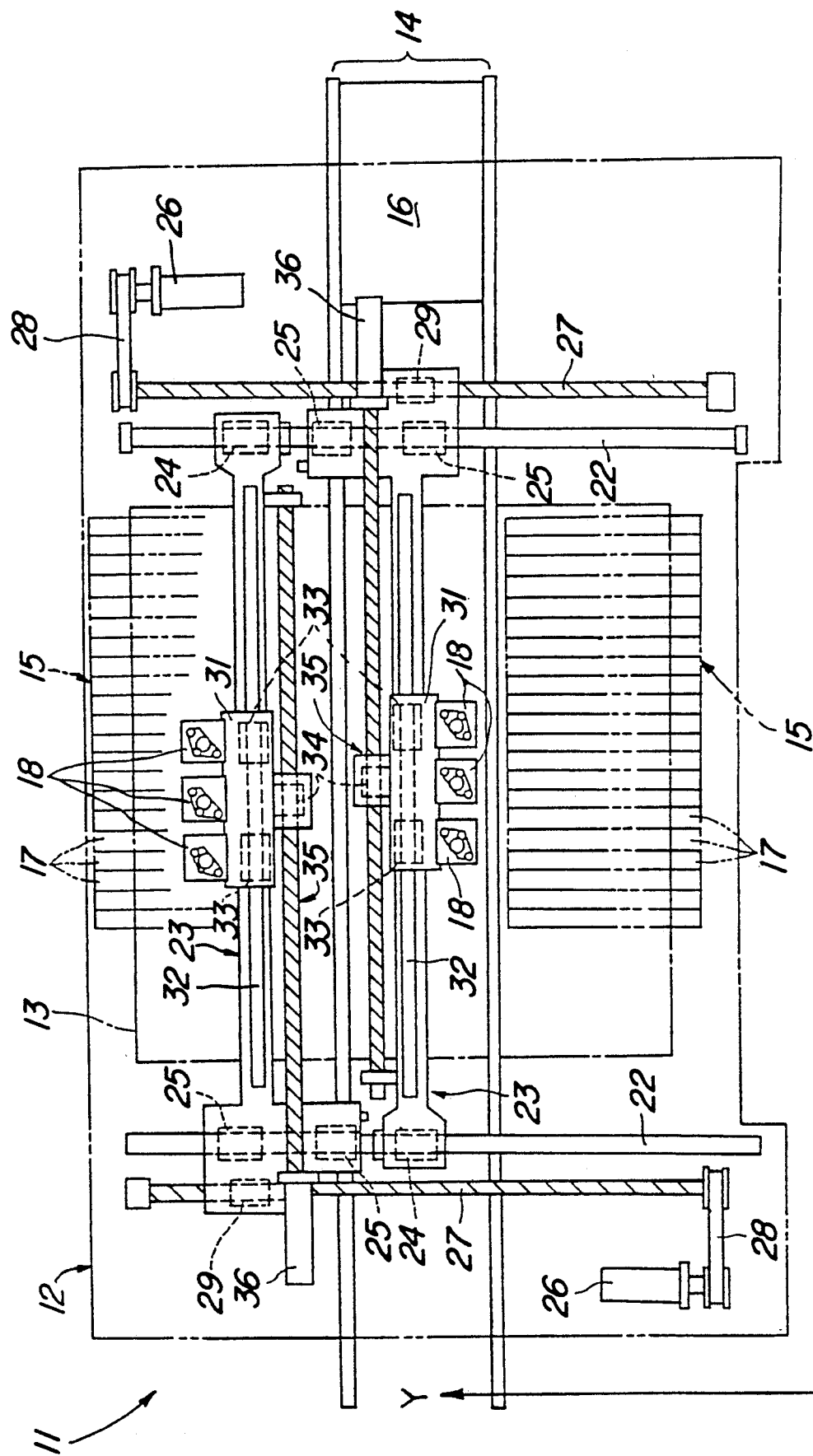
FIG. 1 is a top plan view of a circuit board assembling device constructed in accordance with a first embodiment of the invention.

Referring first to FIGS. 1 through 5, a circuit board assembling device constructed in accordance with a first embodiment of the invention is depicted and is identified generally by the reference numeral 11. Although the invention is particularly adapted for use in conjunction with the assembly of printed circuit boards, it is to be understood that certain of the aspects of the invention may be employed with other types of devices wherein pick or place units are employed to move articles from one location to another. However, the apparatus 11 has particular utility in connection with the assembly of components of a very small nature upon a compact circuit board.

The device 11 includes a work table or base, indicated generally by the reference numeral 12, that has a work area that is indicated generally by the block 13. Articles onto which workpieces are to be assembled or placed, such as circuit boards, are delivered to the work area 13 by means of a belt type conveyor 14. The belt type conveyor 14 delivers articles to the table 12 along the X—X axis and a suitable mechanism is provided for holding the articles in the work area 13 during the assembly operation. Since this part of the apparatus forms no part of the invention, its description is not believed to be necessary to understand the construction and operation of the invention.

Disposed on opposite sides of the work area 13 are a pair of workpiece supplies 15 which may supply small workpieces such as integrated circuit chips for assembly onto the presented circuit boards. Such a board is indicated at 16 in FIGS. 1 and 5. The supply areas 15 may comprise any type of supply but in connection with the assembly of printed circuit boards, the supplies 15 are preferably feed rolls 17 that contain integrated circuits (chips) that are carried on a tape. Such devices are well known in this art.

The apparatus 11 is particularly adapted for picking these workpieces off of the supply tape 17 and depositing them on the printed circuit board 16 contained within the work area 13. Gripping devices, indicated generally by the reference numeral 18 are provided for picking the workpieces from the feed roll 17 and depositing them on the printed circuit board 16. The gripping devices 18 may be of any known type and specifically may be of the type that employ a vacuum source for attracting the workpiece form the feed roll 17 and a series of pivotally supported fingers that grip and position the workpiece when held by the vacuum source.

Figure 2:
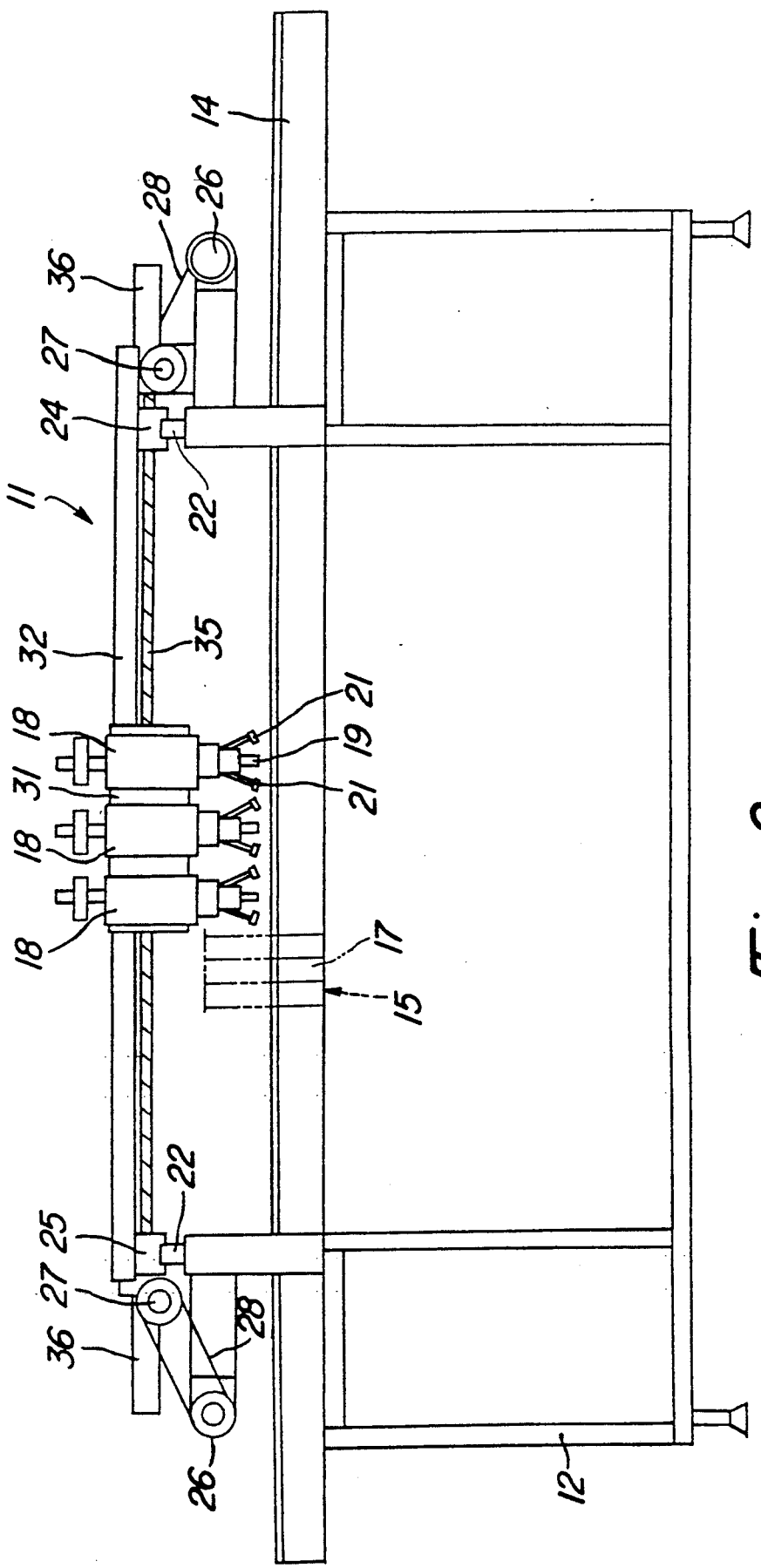
FIG. 2 is a side elevational view of the device.
Figure 3:
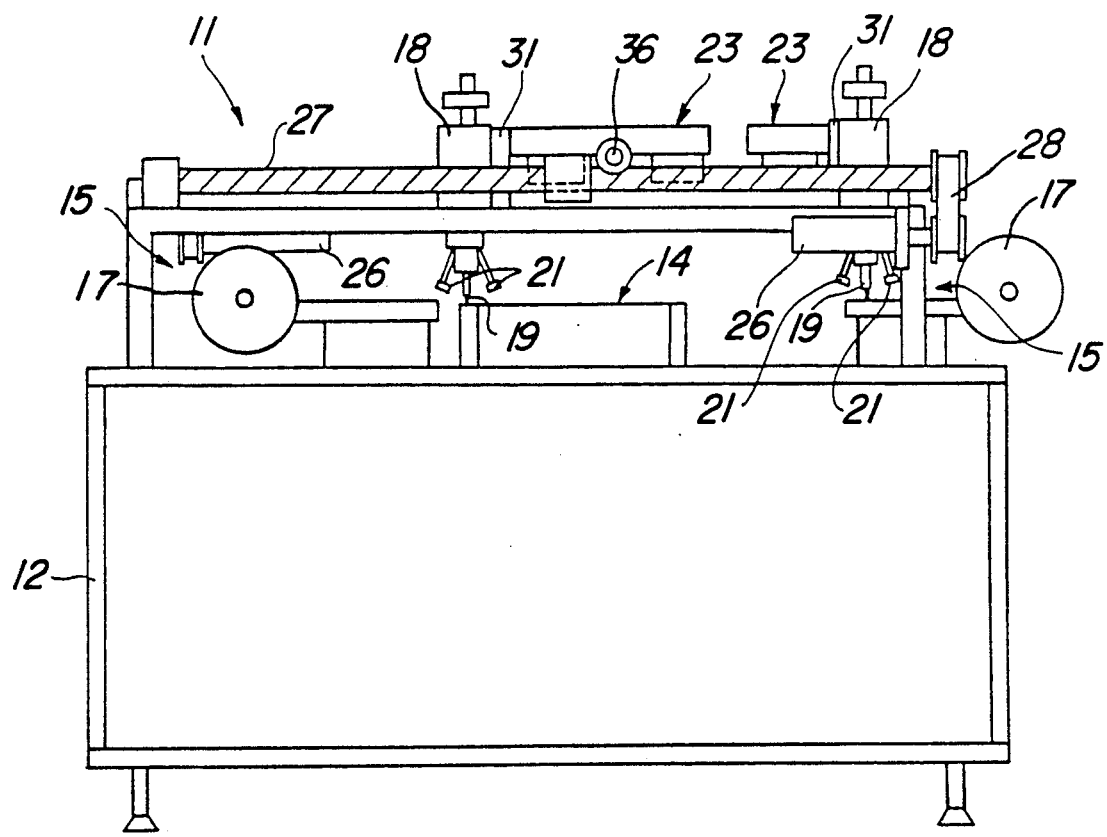
FIG. 3 is an end elevational view of the device.

As may be best seen in FIGS. 2 and 3, the gripping devices 18 of the aforedescribed type are schematically illustrated wherein the vacuum source is indicated at 19 and the pivotally supported gripping fingers are indicated at 21. As has been noted, however, various other types of gripping devices may be employed in conjunction with the invention.

The gripping devices 18 are supported for movement in the X—X and Y—Y directions by means of a mechanism which embodies the invention and which will now be described in detail. This mechanism includes a pair of guide rails 22 that extend on opposite ends of the work area 13 in the Y—Y direction. The guide rails 22 are supported in any suitable manner by the table 12. A pair of carriages 23 is supported by the guide rails 22 so that each carriage 23 may move in the Y—Y direction along the guide rails 17.

The supporting mechanism for the carriages 23 may be best seen in FIG. 4 wherein it will be noted that each carriage 23 has, in plane view, a generally T-shaped configuration. A first bearing 24 is carried at the end of the carriage 23 that is defined by its long leg and is engaged with the guide rail 22 so as to provide a smooth bearing support for this end of the carriage. On the cross leg of the I-shape carriage 23, there are provided a pair of spaced apart bearings 25 that are spaced at a distance b that is dimensioned so as to provide stability and good movement, as will be described. The bearings 25 cooperate with the remaining guide rail 22.

A drive mechanism is also incorporated for moving each of the carriages 23 along the respective guide rails 22 so as to position the gripping devices 18 in the desired position along the Y—Y axis. The drive mechanism for each carriage 23 also may be best understood by reference to FIG. 4 wherein it will be noted that there is provided an electric motor 26 that drives a feed screw 27 through a belt drive 28. Each feed screw 27 is disposed at a respective side of one of the guide rails 22 and is spaced from it by a distance "a" which is substantially less than the dimension "b". A recirculating ball nut 29 or the like is carried by the carriage 23 outwardly of the bearings 25 and is engaged with the feed screw 27 for driving the carriages 23 in the Y—Y direction when the respective motor 26 is energized. Since the dimension "a" is substantially less than the dimension "b", cocking of the carriage 23 is precluded and it is not necessary to provide a pair of bearings at the end of the carriage that is spaced from the bearing pair 25.

Referring to FIG. 1, it should be noted that the drive mechanism for one of the carriages 23 is disposed at the opposite side of the device 11 from the drive for the other of the carriages 23. As a result, it is possible to make the overall arrangement compact since the drive mechanisms are disposed outwardly of the work area 13 and on opposite sides of it.

The grippers 18 associated with each of the carriages 23 are supported by a respective carrier 31. Each carrier 31 is slidably supported relative to the carriage 23 by means of a guide rail 32 that extends along the carriage 23 in the X—X direction. A pair of spaced apart bearings 33 are provided for this support. The carriers 31 are provided with extending portions that carry feed nuts 34 that are engaged with feed screws 35 that are journaled on the respective carriage 23 and which are driven at one end by means of a drive motor 36. It should be noted that the drive motor 36 associated with each carriage 23 is located at the end of that carriage where its respective feed screw 27 is located. Again, this placement of the units permits a compact assembly. Also, as may be seen in FIG. 1, the bearing arrangement for the carriages 23 and the location of the drives permits the carriages 23 to h=positioned closely adjacent to each other. As a result of this, it is possible that the grippers 18 carried by each of the carriages 23 can encompass the full area of the printed circuit board 16 as is best illustrated in FIG. 5.

Figure 5:
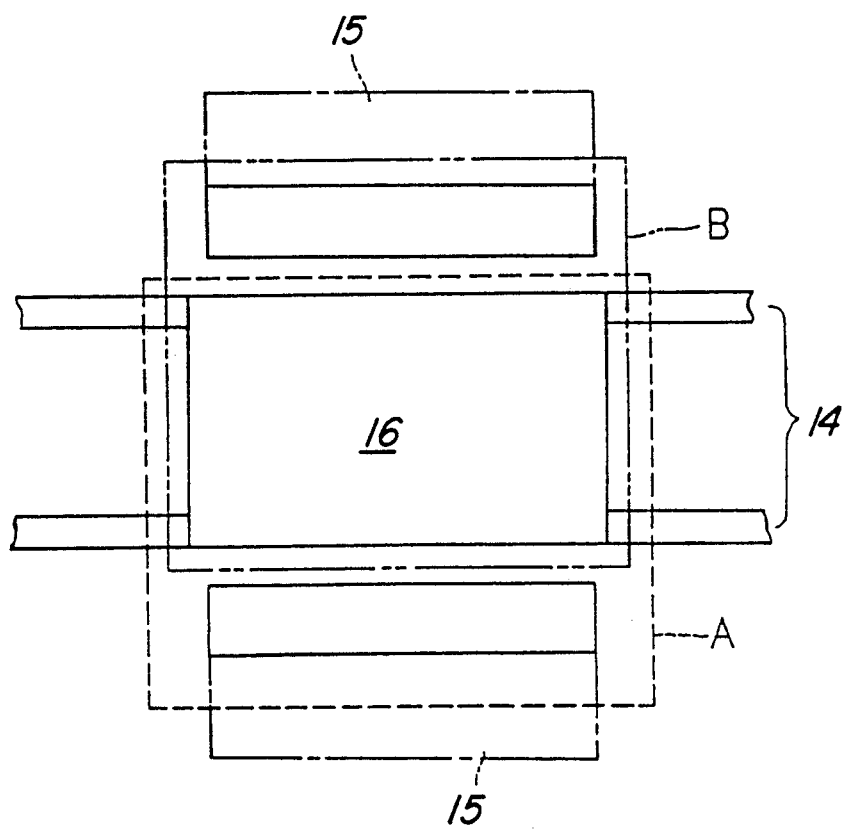
FIG. 5 is a schematic view showing the area that is traversed by each of the carriages and its associated gripping means.

As may be seen in FIG. 5, each carriage 23 is adapted to travel through a respective path A or B, each of which encompasses its respective supply area 15 and the complete area encompassing the circuit board 16. In FIG. 5 the widths of the area A and B are shown as different and this is merely for the sake of illustration purposes. The widths may be the same so long as the travel encompasses the entire circuit board 16 and the full width of the supply area 15. As a result, the supply areas 15 may be provided with a number of different types of IC chips that can h=placed at any location on the circuit board 16 through the movement of the gripping devices 18 along the X—X direction by the drive motors 36 or along the Y—Y direction by means of the drive motors 26. As a result, the device has extreme versatility while, at the same time, offering an extremely compact arrangement.

The device operates generally in the following manner. The conveyor 14 delivers a printed circuit board 16 to the work area 13 once the assembly of the previously presented circuit board has been completed. The drive motors 26 and 36 are then operated in a predetermined sequence so as to present the respective gripping devices 18 to their respective supply areas 15 so as to select the appropriate integrated circuit chip or other article from the feed roll 17 for assembly onto the board 15. It should be noted that since plural gripping devices 18 are carried by each carrier 31, more than one article may be picked up and placed at the same time. The circuitry and control logic for achieving this motion may be of any known type and those skilled in this art will readily understand how to achieve the desired results. However, the circuitry employs a logic that will insure that the carriages 23 will not interfere with each other during their movement and this logic is shown in FIG. 6.

Figure 6:
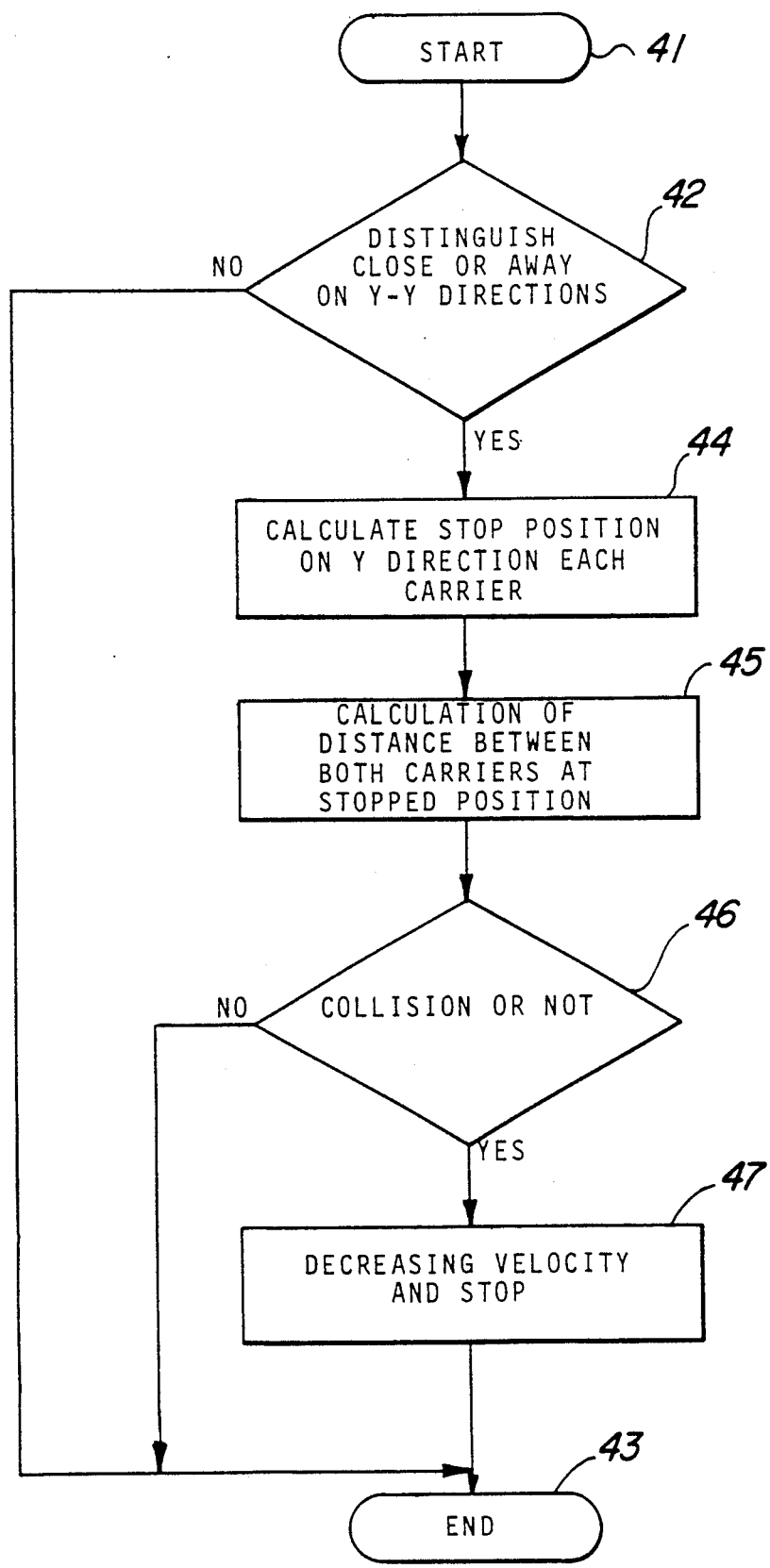
FIG. 6 is a block diagram showing the logic for operating the carriages to prevent interference.

Referring now to FIG. 6, the program for preventing the interference starts at the step 41 and then will distinguish at the step 42 whether or not the programmed operation for the device is such that the carriages 23 are moving toward each other in the Y—Y direction at step 42. If the carriages 23 are being moved away from each other, the program will immediately exit at the step 43 since interference is not going to occur.

If, however, it is determined at the step 42 that the carriages 23 are moving toward each other in the Y—Y direction, the program then calculates at the step 44 what the final Y—Y position for each carriage 23 will be. The system them at the step 45 calculates the distance between the carriers at their stopped position. It is then calculated at the step 46 whether or not the stop positions will cause interference. If it is determined that it will not, the program exits at the step 43.

If, on the other hand, it is determined at the step 46 that a collision is likely, the program moves to the step 47 wherein the velocity of one of the carriages is reduced and it is stopped short of the collision point.

Figure 7:
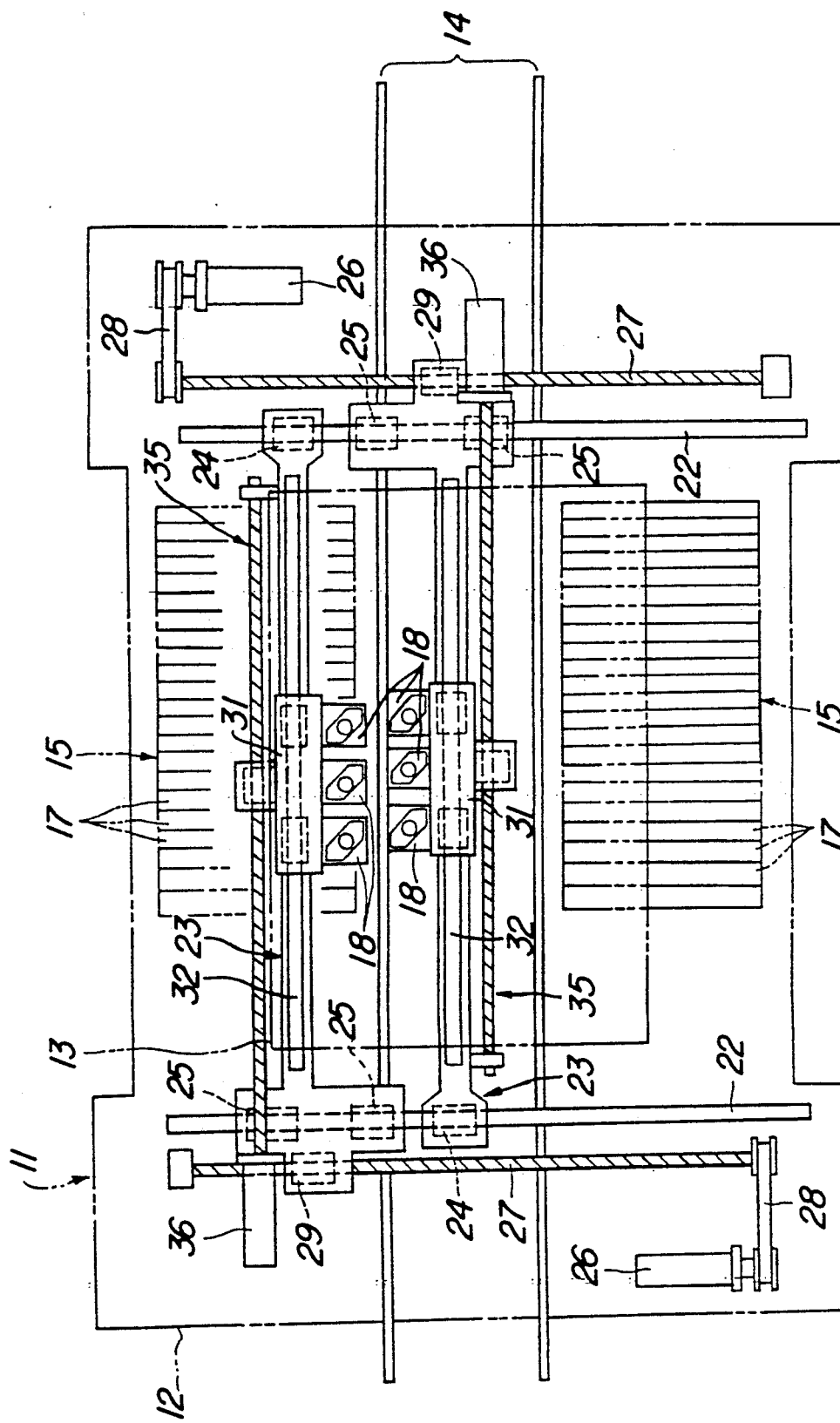
FIG. 7 is a top plan view, in part similar to FIG. 1, showing another embodiment of the invention.

In the embodiment of the invention thus far described, each carriage 23 is adapted to span the entire work area of the circuit board 16 so as to place a IC chip or other component from its respective storage area anywhere on the board. However, the gripping devices 18 are supported on the sides of the carriages 23 opposite to the adjacent carriage and, hence, the gripping devices of one carriage cannot pick up workpieces from the supply area at each side of the device. That is, because of the outside placement of the gripping devices, the gripping devices can only pick up workpieces from the supply rolls 17 at their respective side. In many applications, this is completely satisfactory and, in fact, desirable because then the likelihood of interference between the carriages is reduced because the carriages can move considerably quite close to each other. However, in some situations, it may be desirable to permit either carriage to pick up workpieces from either side of the device and FIG. 7 shows such an embodiment. Since the basic components of this embodiment are the same as that previously described, those components have been identified by the same reference numerals. It should be noted, however, in this embodiment, the gripping devices 18 are carried by the carriers 31 on the side facing the adjacent carriage 23. As a result, a given gripping device can pick up a workpice from either supply side 15. However, the carriages cannot move as close to each other as with the previously described embodiment.

It should be readily apparent from the foregoing description that a number of embodiments of the invention have been illustrated and described and which permit a wide latitude of assembly operations in an extremely compact area. Although two embodiments of the invention have been illustrated and described, various changes and modifications may be made without departing from the spirit and scope of the invention as defined by the appended claims.

We claim:

1. An arrangement for placing workpieces from supplies located at opposite sides of a work table upon an article supported on the work table, said arrangement comprising a pair of spaced apart guide rails extending between said sides, first and second carriages each supported for movement upon said guide rails between a position contiguous to a respective one of said sides and a position over the article supported on the work table, a pair of gripping means each supported for movement along a respective one of said carriages and adapted to pick up a workpiece when the respective carriage is contiguous to the respective side and deposit the workpiece on the article, first drive means contiguous to one of said guide rails for driving one of said carriages along said guide rail, second drive means contiguous to the other of said guide rails for driving the other of said carriages therealong, said first and second drive means comprising feed screws positioned outwardly of said guide rails relative to the transverse center of the work tables and a respective motor for driving each of said feed screws, one of said motors being positioned at one side of the arrangement and the other of said motors being positioned at the other side of the arrangement, said carriages and said guide rails being configured so that the gripping means carried by the respective guide carriages may deposit articles on the same area of the workpiece, and further drive means for driving said gripping means along the respective carriages.

2. An arrangement for placing workpieces as set forth in claim 1 wherein the further drive means comprises third drive means for driving one of the gripping means along its respective carriage and fourth drive means for driving the other gripping means along its respective carriage.

3. An arrangement for placing workpieces as set forth in claim 2 wherein the first and third drive means are located at the same side of the arrangement and the second and fourth drive means are located at the same side of the arrangement.

4. An arrangement for placing workpieces as set forth in claim 3 wherein the third and fourth drive means are carried by the respective carriages.

5. An arrangement for placing workpieces as set forth in claim 4 wherein the third and fourth drive means comprise third and fourth feed screws carried by the carriages, respectively.

6. An arrangement for placing workpieces from supplies located at opposite sides of a work table upon an article supported on the work table, said arrangement comprising a pair of spaced apart guide rails extending between said sides, first and second carriages each supported for movement upon said guide rails between a position contiguous to a respective one of said sides and a position over the article supported on the work table, a pair of gripping means each supported for movement along a respective one of said carriages and adapted to pick up a workpiece when the respective carriage is contiguous to the respective side and deposit the workpiece on the article, first drive means contiguous to one of said guide rails for driving one of said carriages along said guide rails, second drive means contiguous to the other of said guide rails for driving the other of said carriages therealong, and further drive means for driving said gripping means along the respective carriages, each of said carriages being supported on the respective rails by a single first bearing fixed to one end of the respective carriage remote from its respective drive means and engaged with the respective guide rail and a pair of spaced bearings carried by the carriage and engaged with the guide rail contiguous to the respective drive means.

7. An arrangement for placing workpieces as set forth in claim 6 wherein the first and second drive means comprise feed screws positioned outwardly of the guide rails relative to the transverse center of the work tables.

8. An arrangement for placing workpieces as set forth in claim 7 wherein each of the drive means further includes a respective motor for driving each of the feed screws, one of said motors being positioned at one side of the arrangement and the other of said motors being positioned at the other side of the arrangement.

9. An arrangement for placing workpieces as set forth in claim 8 wherein the further drive means comprises third drive means for driving one of the gripping means along its respective carriage and fourth drive means for driving the other gripping means along its respective carriage.

10. An arrangement for placing workpieces as set forth in claim 9 wherein the first and third drive means are located at the same side of the arrangement and the second and fourth drive means are located at the same sides of the arrangement.

11. An arrangement for placing workpieces as set forth in claim 10 wherein the third and fourth drive means are carried by the respective carriages.

12. An arrangement for placing workpieces as set forth in claim 1 wherein each gripping means is supported on the side of its supporting carriage facing the remaining carriage.

13. An arrangement for placing workpieces as set forth in claim 12 wherein the further drive means comprises third drive means for driving one of the gripping means along its respective carriage and fourth drive means for driving the other gripping means along its respective carriage.

14. An arrangement for placing workpieces as set forth in claim 13 wherein the first and third drive means are located at the same side of the arrangement and the second and fourth drive means are located at the same side of the arrangement.

15. An arrangement for placing workpieces as set forth in claim 14 wherein the third and fourth drive means are carried by the respective carriages.

16. An arrangement for placing workpieces as set forth in claim 15 wherein third and fourth drive means comprise third and fourth feed screws carried by the carriages, respectively.

17. An arrangement for placing workpieces as set forth in claim 2 further including control means for operating said carriage drive means for precluding interference of said carriages and said gripping means with each other.

* * * * *